United States Patent [19]
Kim

[11] Patent Number: 5,938,784
[45] Date of Patent: Aug. 17, 1999

[54] LINEAR FEEDBACK SHIFT REGISTER, MULTIPLE INPUT SIGNATURE REGISTER, AND BUILT-IN SELF TEST CIRCUIT USING SUCH REGISTERS

[75] Inventor: Heon-Cheol Kim, Seoul, Rep. of Korea

[73] Assignee: Samsung Electronics, Co., Ltd., Kyungki-do, Rep. of Korea

[21] Appl. No.: 08/951,189

[22] Filed: Oct. 15, 1997

[30] Foreign Application Priority Data

Oct. 21, 1996 [KR] Rep. of Korea ........................ 96-47171

[51] Int. Cl.$^6$ ..................................................... G01R 31/28
[52] U.S. Cl. ............................................................. 714/733
[58] Field of Search ................................ 371/22.31, 22.5, 371/22.4, 22.33, 25.1, 27.2; 395/183.06, 183.18, 183.19; 364/489, 580; 324/765; 365/201; 714/25, 30, 43, 728, 733, 742

[56] References Cited

U.S. PATENT DOCUMENTS

| | | | |
|---|---|---|---|
| 5,247,525 | 9/1993 | Taira et al. ............................. | 371/22.4 |
| 5,412,665 | 5/1995 | Gruodois et al. ...................... | 371/27 |
| 5,450,414 | 9/1995 | Lin ......................................... | 371/22.3 |
| 5,457,697 | 10/1995 | Malleo-Roach et al. ............... | 371/22.3 |
| 5,588,006 | 12/1996 | Nozuyama ............................. | 371/3 |
| 5,631,913 | 5/1997 | Maeda ................................... | 371/22.4 |
| 5,703,818 | 12/1997 | Osawa ................................... | 365/201 |
| 5,719,913 | 2/1998 | Maeno .................................. | 377/54 |

*Primary Examiner*—Robert W. Beausoliel, Jr.
*Assistant Examiner*—Nadeem Iqbal
*Attorney, Agent, or Firm*—Marger Johnson & McCollom, P.C.

[57] ABSTRACT

A built-in self test (BIST) circuit using a linear feedback shift register (LFSR) and a multiple input signature register (MISR) requiring reduced circuitry exclusive of the number of inputs and outputs of the circuit to be tested. The BIST circuit is built in a prescribed circuit having a memory to test a target circuit in the prescribed circuit. The BIST circuit includes an LFSR, including a first logic section which is composed of a plurality of XOR gates and selection sections, and a first memory which is a part of the memory, for performing a primitive polynomial, an MISR, including a second logic section which is composed of a plurality of XOR gates and selection sections, and a second memory which is a part of the memory, for performing the primitive polynomial, and a BIST control section for controlling data input/output between the first and second memories and the target circuit and providing selection signals for controlling the selection sections in the first and second logic sections, the BIST control section controlling the target circuit and comparing operation results of the target circuit to perform the test of the target circuit.

12 Claims, 3 Drawing Sheets

LINEAR FEEDBACK SHIFT REGISTER, MULTIPLE INPUT SIGNATURE REGISTER, AND BUILT-IN SELF TEST CIRCUIT USING SUCH REGISTERS

BACKGROUND OF THE INVENTION

1. Field of the Invention

The present invention relates generally to a test circuit built into a certain circuit to be tested. In particular, the present invention relates to a linear feedback shift register, a multiple input signature register, and a built-in self test circuit using such registers.

The present application is based on Korea Patent Application No. 96-47171 which is incorporated herein by reference for all purposes.

2. Description of the Related Art

A built-in self test (BIST) circuit means a test circuit such as a test input applying circuit, an output-responsive discriminating circuit, etc., which is built into the target circuit to be tested such as a large scale integrated circuit (LSI), a printed circuit board, a device, etc. The BIST circuit enables the target circuit to be tested without using a separate tester or a test equipment.

According to one conventional method for implementing the BIST circuit, a test is created utilizing a random signal, the results of the circuit to be tested under the signal are compressed, and the finally compressed results are compared with one another. A linear feedback shift register (LFSR) and a multiple input signature register (MISR) have been primarily used to implement such a BIST circuit.

FIG. 1 is a schematic circuit diagram of a conventional LFSR. Referring to FIG. 1, the conventional LFSR includes storage elements 2, 4, . . . , 6, and 8 for storing coefficients Ci of a primitive polynomial, XOR gates 10, 12, . . . , 14, and 16 for XOR-gating the corresponding coefficient, stored data, and input data, and D-type flip-flops 20, 22, . . . , 24, and 26 for storing data of 1 bit, respectively.

The conventional LFSR of FIG. 1 is a circuit for creating a pseudo-random pattern, and performs the following primitive polynomial:

$$P=1+C_1X^1+C_2X^2+ \ldots +C_{n-1}X^{n-1}+C_nX^n \qquad \text{Eq.(1)}$$

where $C_i$ denotes the coefficient of the respective terms of the above Eq. (1). If the coefficient of the term is '1', a feedback path exists as shown in FIG. 1, while if the coefficient is '0', no feedback path exists.

FIG. 2 is a schematic circuit diagram of a conventional MISR. Referring to FIG. 2, the conventional MISR includes storage elements 50, 52, . . . , 54, and 56 for storing coefficients of a primitive polynomial, XOR gates 30, 32, . . . , 34, and 36 for XOR-gating the corresponding coefficient, stored data, and input data, and D-type flip-flops 40, 42, . . . , 44, and 46 for storing data of 1 bit.

The conventional MISR has a structure similar to the conventional LFSR of FIG. 1. But, unlike the LFSR of FIG. 1, the MISR of FIG. 2 receives and processes the data D1, D2, . . . , $D_{n-1}$, and $D_n$ in parallel.

The number of flip-flops in the conventional LFSR of FIG. 1 is determined in accordance with the number of inputs of the circuit to be tested, while the number of flip-flops in the conventional MISR of FIG. 2 is determined in accordance with the number of outputs of the circuit to be tested. Since the number of flip-flops in the conventional BIST circuit, implemented using the LFSR and the MISR circuits of FIGS. 1 and 2, is dependant upon the number of inputs and outputs of the circuit to be tested, a circuit to be tested having a large number of inputs and outputs will require a corresponding large number of flip-flops on the LFSR and MISR test circuits. Consequently, the circuit real estate or overhead required for such a BIST circuit increases dramatically.

Accordingly, the need exists for an LFSR and/or MISR circuit which is implemented using a memory already existing in a circuit to be tested.

SUMMARY OF THE INVENTION

In one aspect of the present invention, there is provided an LFSR which is employed in a BIST circuit, built in a prescribed circuit having a memory, for testing the circuit and which performs a primitive polynomial. It is preferable that the LFSR comprises storage elements of N (where, N is not less than 1.) for storing coefficients of the primitive polynomial, XOR gates of N for respectively XOR-gating the corresponding coefficient stored in the corresponding storage element and data of the primitive polynomial read out from the memory, selection means of N for respectively receiving an output of the corresponding XOR gate and data used in the prescribed circuit and selectively outputting the received data to the memory in response to a selection signal, and control means for generating the selection signal in accordance with a test mode and controlling data input/output of the memory so that the memory outputs the data corresponding to an output of the selection means as the primitive polynomial data.

In another aspect of the present invention, there is provided an MISR which is employed in a BIST circuit, built in a prescribed circuit having a memory, for testing the circuit and which performs a primitive polynomial. It is preferable that the MISR comprises storage elements of N (where, N is not less than 1.) for storing coefficients of the primitive polynomial, XOR gates of N for respectively XOR-gating the corresponding coefficient stored in the corresponding storage element, data of the primitive polynomial read out from the memory, and data externally inputted, selection means of N for respectively receiving an output of the corresponding XOR gate and data used in the prescribed circuit and selectively outputting the received data to the memory in response to a selection signal, and control means for generating the selection signal in accordance with a test mode and controlling data input/output of the memory so that the memory outputs the data corresponding to an output of the selection means as the primitive polynomial data.

In still another aspect of the present invention, there is provided a BIST circuit, built in a prescribed circuit having a memory, for testing a target circuit in the prescribed circuit. It is preferable that the BIST circuit comprises an LFSR, including a first logic section which is composed of a plurality of XOR gates and selection means, and a first memory which is a part of the memory, for performing a primitive polynomial, an MISR, including a second logic section which is composed of a plurality of XOR gates and selection means, and a second memory which is a part of the memory, for performing the primitive polynomial, and a BIST control section for controlling data input/output between the first and second memories and the target circuit and providing selection signals for controlling the selection means in the first and second logic sections, the BIST control section controlling the target circuit and comparing operation results of the target circuit to perform the test of the target circuit.

BRIEF DESCRIPTION OF THE DRAWINGS

The above objects, other features, and advantages of the present invention will become more apparent by describing the preferred embodiments thereof with reference to the accompanying drawings, in which.

DETAILED DESCRIPTION OF PREFERRED EMBODIMENTS

The construction and operation of the LFSR, the MISR, and the BIST circuit using the LFSR and the MISR according to the present invention will now be explained with reference to the accompanying drawings.

Figure 3:
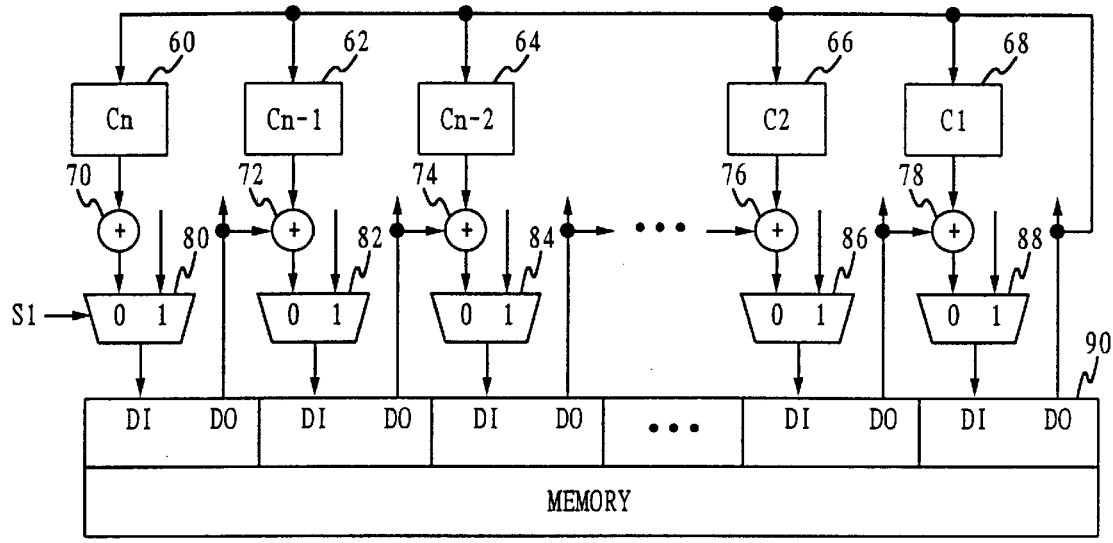
FIG. 3 is a schematic circuit diagram of the LFSR according to the present invention.

FIG. 3 is a schematic circuit diagram of the LFSR according to the present invention. Referring to FIG. 3, the LFSR according to the present invention includes a plurality of storage elements 60, 62, 64, . . . , 66, and 68, XOR gates 70, 72, 74, . . . , 76, and 78, and multiplexers 80, 82, 84, . . . , 86, and 88, and a memory 90.

Figure 1:
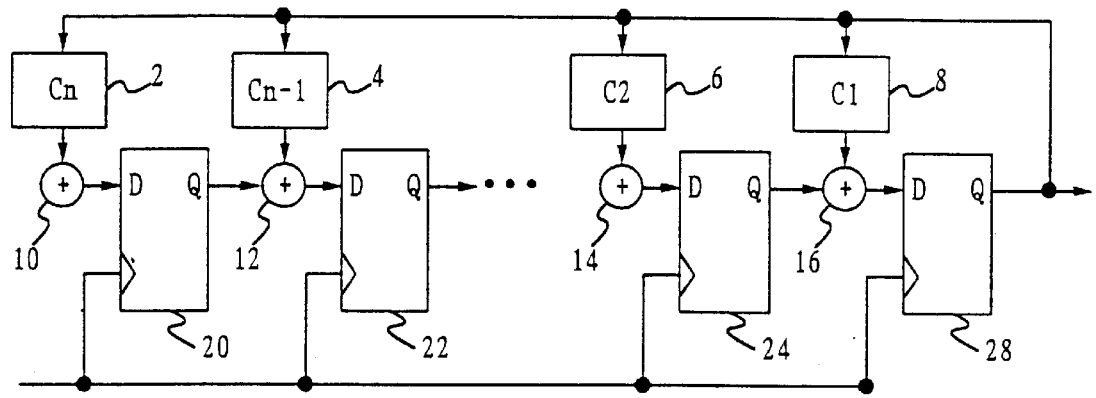
FIG. 1 is a schematic circuit diagram of a conventional LFSR.
Figure 2:
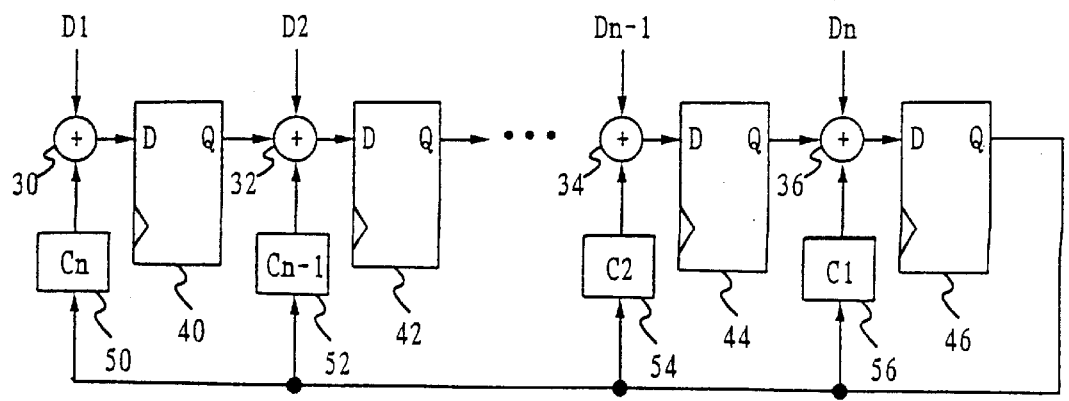
FIG. 2 is a schematic circuit diagram of a conventional MISR.

Each cell of the memory 90 as shown in FIG. 3 serves as a sequential element such as the flip-flop of the conventional LFSR of FIG. 1, and the LFSR of FIG. 3 has the same XOR gates and feedback paths as the LFSR of FIG. 1.

The storage elements 60, 62, 64, . . . , 66, and 68 of FIG. 3 store the respective coefficients of the primitive polynomial Eq.(1) and then output them to the corresponding XOR gates 70, 72, 74, . . . , 76, and 78. The n XOR gates 70, 72, 74, . . . , 76, and 78 XOR-gate the coefficients stored in the corresponding storage elements 60, 62, 64, . . . , 66, and 68 and primitive polynomial data D0 read out from the memory 90, respectively, and output the XOR-gated values to the corresponding multiplexers 80, 82, 84, . . . , 86, and 88.

The n multiplexers 80, 82, 84, . . . , 86, and 88 receive the outputs of the corresponding XOR gates 70, 72, 74, . . . , 76, and 78 and the data used in a circuit employing the LFSR according to the present invention, and selectively output the inputted data D1 to the memory 90 in response to the selection signal S1 provided from a control section (not illustrated). The control section provides the selection signals so that normal data applied through a data bus is outputted to the memory 90 in a normal mode, and the result of the corresponding XOR-gating is outputted to the memory 90 in a BIST mode, to form a shift chain.

Here, the control section generates an address of the memory 90 in such a manner that it creates the address which is distinct from that in the normal mode through the multiplexer, or it resets an address generation logic circuit without using the multiplexer so that the '0' address is used in the BIST mode.

Figure 4:
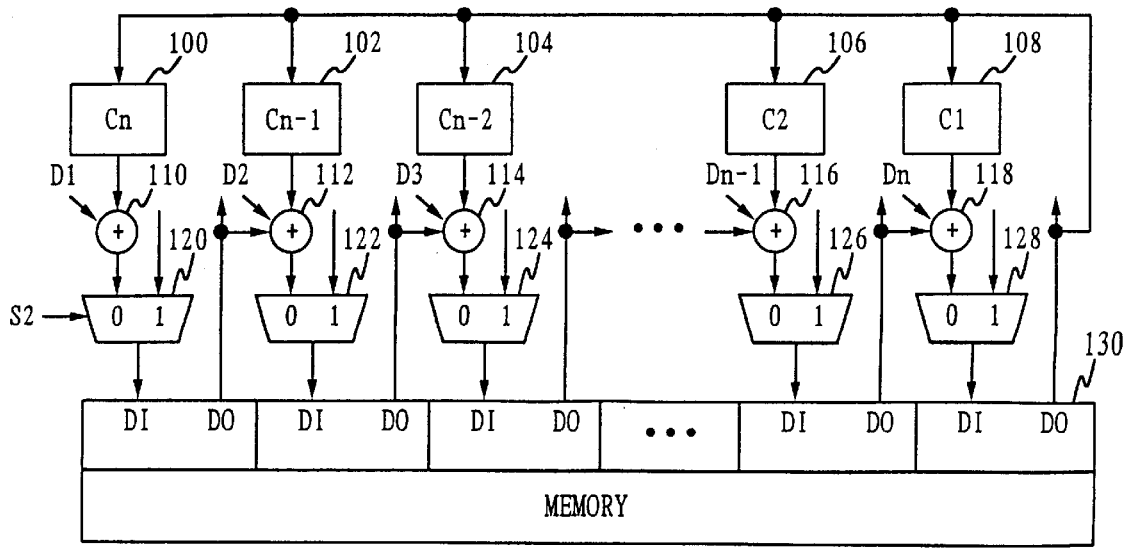
FIG. 4 is a schematic circuit diagram of the MISR according to the present invention.

FIG. 4 is a schematic circuit diagram of the MISR according to the present invention. Referring to FIG. 4, the MISR according to the present invention includes a plurality of storage elements 100, 102, 104, . . . , 106, and 108, XOR gates 110, 112, 114, . . . , 116 and 118, and multiplexers 120, 122, 124, . . . , 126, and 128, and a memory 130.

The MISR as shown in FIG. 4 has the same construction and performs the same operation as the LFSR of FIG. 3 except that each XOR gate has an additional input. Specifically, each XOR gate in the MISR XOR-gates the data D1, D2, D3, . . . , $D_{n-1}$, or $D_n$ inputted in parallel, the coefficient stored in the corresponding storage element, and the data D0 outputted from the memory 130, and outputs the XOR-gated data to the corresponding multiplexer.

Figure 5:
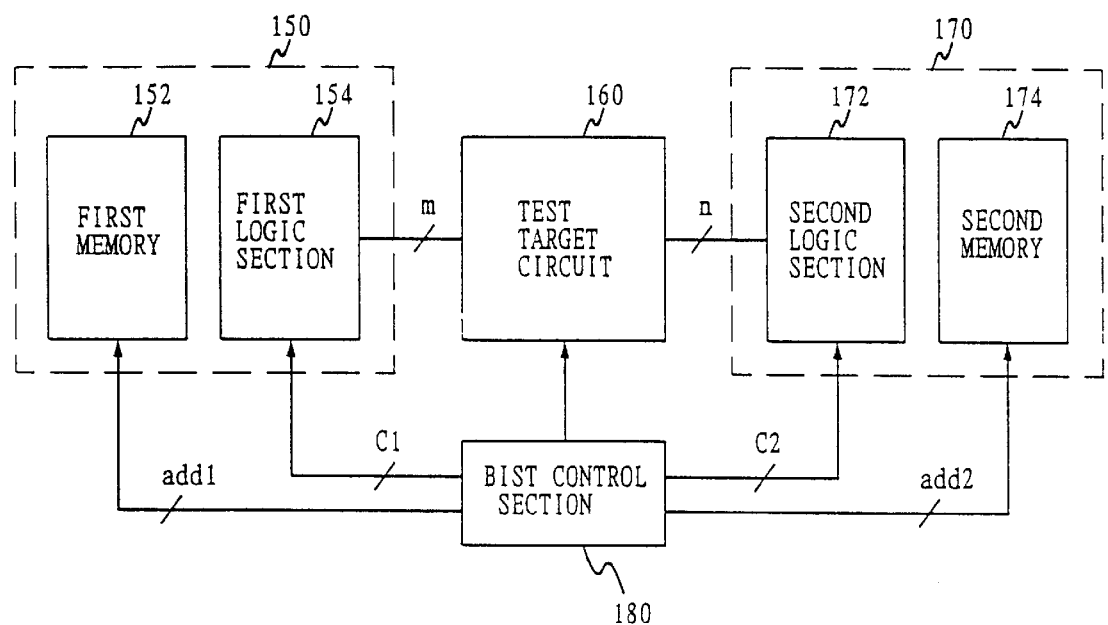
FIG. 5 is a schematic circuit diagram of the BIST circuit according to the present invention.

FIG. 5 is a schematic circuit diagram of the BIST circuit according to the present invention. Referring to FIG. 5, the BIST circuit according to the present invention includes an LFSR 150 comprising a first memory 152 and a first logic section 154, a MISR 170 comprising a second memory 174 and a second logic section 172, a target circuit 160, and a BIST control section 180.

The LFSR 150 as shown in FIG. 5 corresponds to the LFSR of FIG. 3, and the MISR 170 in FIG. 5 corresponds to the MISR of FIG. 4 according to the present invention. Specifically, the first memory 152 and the first logic section 154 correspond to the memory 90, the XOR gates, and the multiplexers of FIG. 3, while the second memory 174 and the second logic section 172 correspond to the memory 130, the XOR gates, and the multiplexers of FIG. 4, respectively.

The BIST control section 180 of FIG. 5 controls the data input/output between the first and second memories 152 and 174 and the target circuit 160, and outputs the selection signals for controlling the multiplexers in the first and second logic sections 154 and 172. Also, the BIST control section 180 controls the test target circuit 160, and compares the operation results of the target circuit 160 to perform the test of the target circuit.

The first and second memories 152 and 174 of FIG. 5 may be replaced by the memory employed in the circuit which includes the BIST circuit.

As described above, according to the present invention, the BIST circuit is implemented using the LFSR and the MISR which share a memory built in a circuit to be tested, and thus the area of the BIST circuit can be greatly reduced regardless of the number of inputs and outputs of the circuit to be tested.

While the present invention has been described and illustrated herein with reference to the preferred embodiments thereof, it will be understood by those skilled in the art that various changes in form and details may be made therein without departing from the spirit and scope of the invention.

What is claimed is:

1. A built-in self test (BIST) circuit formed within a target circuit having a memory, said BIST comprising:

a linear feedback shift register (LFSR), including a first logic section having a plurality of XOR gates and selection means, and a first memory which is a part of said memory of said target circuit, for performing a primitive polynomial read out from the memory of the target circuit;

a multiple input signature register (MISR), including a second logic section which is composed of a plurality of XOR gates and selection means, and a second memory which is a part of said memory of said target circuit, for performing said primitive polynomial from the memory of the target circuit; and a BIST control section for controlling data input/output between said first and second memories and said target circuit and providing selection signals for controlling said selection means in said first and second logic sections, said BIST control section controlling said target circuit and comparing operation results of the target circuit.

2. A built-in self test (BIST) circuit as claimed in claim 1, wherein said memory in said target circuit is shared by said LFSR and said MISR to serve as said first and second memories instead.

3. A built-in self test (BIST) circuit as claimed in claim 1, wherein said linear feedback shift register (LFSR) comprises:

a storage element for storing a coefficient of the primitive polynomial;

an XOR gate adapted to receive said coefficient and data of said primitive polynomial read out from memory of the target circuit, and outputting an XOR-gated signal responsive to said coefficient and data of said primitive polynomial; and selection means adapted to receive said XOR-gated signal and data used in the target circuit, said selection means being operative under a selection signal to selectively output said data used in the target circuit to the memory of the target circuit in response to the selection signal.

4. A built-in self test (BIST) circuit as claimed in claim 1, wherein said multiple input signature register (MISR) comprises:

a storage element for storing a coefficient of a primitive polynomial;

an XOR gate adapted to receive said coefficient, said data of said primitive polynomial read out from memory of the target circuit and data externally inputted, and outputting an XOR-gated signal responsive to said coefficient, the data of said primitive polynomial, and the data externally inputted; and selection means adapted to receive said XOR-gated signal, said data used in the target circuit, said selection means being operative under a selection signal to selectively output said data used in the target circuit to the memory of the target circuit in response to the selection signal.

5. A method for testing a target circuit coupled to a memory over a data bus, comprising the steps of:

coupling a test circuit to the memory associated with the target circuit, said test circuit including a plurality of storage elements;

storing a coefficient of a primitive polynomial within at least one of the storage elements;

reading out data of the primitive polynomial from the memory associated with the target circuit;

XOR-gating the coefficient of the primitive polynomial from said storage element with the data of said primitive polynomial;

generating a selection signal corresponding to either a test mode or a normal mode for controlling data input/output from said memory;

multiplexing an output of the XOR-gating step with data received over said data bus; and selectively outputting an output of the XOR-gating step to said memory responsive to the test mode selection signal, otherwise shunting the data received over said data bus to memory.

6. A linear feedback shift register (LFSR) adapted to test a target circuit, said target circuit having a data bus coupled to a plurality of memory cells, the LFSR comprising:

a plurality of storage elements, each of said elements being adapted to store a respective one coefficient of a primitive polynomial resulting from a psuedo-random signal;

a plurality of exclusive-OR gates (XORs), each of said gates being adapted to generate XOR-gated values responsive to an output read out from a respective one of the plurality of storage elements and primitive polynomial data read out from the memory cells coupled to the target circuit;

a control circuit adapted to output a selection signal corresponding to either a normal mode or a test mode; and a plurality of multiplexers (MUXs), each of said MUXs receiving a respective one of the XOR-gated values, data from the target circuit data bus, and the output selection signal generated from the control circuit, and outputting to a respective one of the memory cells either the XOR-gated value responsive to the test mode selection signal or data from said data bus responsive to the normal mode selection signal.

7. The LFSR of claim 6, further including a memory output path configured to shunt data from the one memory cell to a next XOR gate of the plurality of XORs of the LFSR to thereby form a shift chain.

8. A multiple input signature register (MISR) adapted to test a target circuit, said target circuit having a data bus coupled to a plurality of memory cells, the MISR comprising:

a plurality of storage elements, each of said elements being adapted to store a respective one coefficient of a primitive polynomial resulting from a pseudo-random signal;

a plurality of exclusive-OR gates (XORs), each of said gates being adapted to generate XOR-gated values responsive to an output read out from a respective one of the plurality of storage elements, primitive polynomial data read out from the memory cells of the target circuit, and data supplied to the plurality of gates in parallel;

a control circuit adapted to output a selection signal corresponding to either a normal mode or a test mode; and a plurality of multiplexers (MUXs), each of said MUXs receiving a respective one of the XOR-gated values, data from the target circuit data bus, and the output selection signal generated from the control circuit, and outputting to a respective one of the memory cells the XOR-gated value responsive to the test mode selection signal and data responsive to the normal mode selection signal.

9. The MISR of claim 8, further including a memory output path configured to shunt data from the one memory cell to a next XOR gate of the plurality of XORs of the MISR to thereby form a shift chain.

10. The method of claim 5, further including the steps of:

generating a distinct memory address from that in normal mode; and shunting the output from the XOR-gated step to the distinct memory address responsive to the test mode selection signal.

11. The method of claim 5, further including the steps of:

resetting an address generation logic circuit associated with the memory; and shunting the output from the XOR-gated step to the '0' address responsive to the test mode selection signal.

12. A method for operating a test circuit with a target circuit having a memory associated therewith, the method comprising the steps of:

coupling a test circuit with memory associated with the target circuit;

reading a coefficient $C_n$ of a primitive polynomial $P=1+C_1X^1+C_2X^2+ \ldots C_{n-1}X^{n-1}+C_nX^n$ into a first XOR gate;

receiving in a first multiplexer an output of the first XOR gate, data input from a data bus of the target circuit, and a selection signal having a normnal-mode state and a test-mode state;

outputting a first multiplexer signal to a first cell of the memory responsive to the selection signal;

reading out the first multiplexer signal from the first cell to a second XOR gate together with the coefficient $C_{n+1}$;

receiving in a second multiplexer an output of the second XOR gate and data input from the data bus of the target circuit;

outputting a second multiplexer signal to a second cell of the memory to thereby form a shift chain.

* * * * *